United States Patent

Graziadei et al.

[11] 3,973,180
[45] Aug. 3, 1976

[54] VOLTAGE BOOSTING DETECTOR CIRCUIT

[75] Inventors: Rinaldo Graziadei, Monza; Marco Siligoni, Milan, both of Italy

[73] Assignee: SGS-ATES Componenti Elettronici S.p.A., Agrate Brianza, Italy

[22] Filed: Oct. 30, 1975

[21] Appl. No.: 627,332

[30] Foreign Application Priority Data
Oct. 31, 1974  Italy.................................. 29002/74

[52] U.S. Cl................................ 321/15; 307/110; 324/119
[51] Int. Cl.²......................................... H02M 7/00
[58] Field of Search...................... 307/110; 321/15; 324/119, 120

[56] References Cited
UNITED STATES PATENTS

| | | | |
|---|---|---|---|
| 3,478,258 | 11/1969 | Nagai..................................... | 321/15 |
| 3,723,850 | 3/1973 | Daniels et al..................... | 321/15 X |
| 3,772,583 | 11/1973 | Sahara et al........................... | 321/15 |

OTHER PUBLICATIONS

RCA Technical Notes, RCA Tn No. 241, "Voltage Reducing Rectifier Circuits", Winfield R. Voch, Jan. 5, 1959.

*Primary Examiner*—William M. Shoop
*Attorney, Agent, or Firm*—Karl F. Ross; Herbert Dubno

[57] ABSTRACT

Two cascaded capacitors, one in series and the other in shunt with a load, are connected across a source of amplitude-modulated oscillations with interposition of a small resistance, preferably the forward resistance of a series diode. The junction (A) of that resistance with the series capacitor is connected to the emitter of a transistor whose collector is energized with a high driving voltage (positive in the case of an NPN transistor) and whose base is tied to a tap on a voltage divider inserted between that collector and the opposite, usually grounded source terminal. The section of the voltage divider between the base and ground may consist of the forward resistance of a single diode, designed to balance the base/emitter threshold of the transistor whereby the aforementioned junction (A) is at ground potential when the source voltage peaks with a polarity opposite that of the collector potential. A biasing battery may be inserted between the voltage divider and ground to provide a voltage pedestal of the same polarity as the collector potential.

8 Claims, 4 Drawing Figures

VOLTAGE BOOSTING DETECTOR CIRCUIT

FIELD OF THE INVENTION

Our present invention relates to a detector circuit of the voltage-booster type designed to translate the envelope of an amplitude-modulated carrier oscillation into an unbalanced signal voltage whose magnitude with respect to ground or some other reference potential substantially equals the peak-to-peak voltage difference between the positive and negative carrier halves.

BACKGROUND OF THE INVENTION

A conventional detector circuit of this type comprises two cascaded capacitors, one of them in series and the other in shunt with a load, connected across the carrier source with interposition of a series diode between the first-mentioned capacitor and the load, the forward resistance of this diode serving as a charging resistance for the shunt capacitor. Another diode is connected between the usually grounded common input and output terminal of the circuit and a junction point formed by the series capacitor with the series diode. One of the half-cycles of the carrier oscillation, i.e. the one (hereinafter assumed to be positive) which passes the series diode, charges the shunt capacitor to a potential somewhat less than the (positive) voltage peak, the difference being due to the forward voltage drop of that diode. Upon the next half-cycle, the junction point between the series capacitor and the series diode is maintained by the shunt diode at a potential somewhat more negative than the reference potential (normally ground), owing to the forward voltage drop of the shunt diode. On the positive-going swing of the carrier oscillation, the voltage $V_A$ at the junction point reaches a value which falls short of the peak-to-peak voltage difference of the input oscillation by a value $V_D$ corresponding to the aforementioned voltage drop.

OBJECTS OF THE INVENTION

The general object of our present invention, therefore, is to provide an improved voltage-boosting detector circuit of this character which eliminates the voltage shortfall referred to.

Another object is to provide means for introducing a desired voltage pedestal, different from that of the common terminal, at the aforementioned junction point.

SUMMARY OF THE INVENTION

In a detector circuit according to our invention, the shunt diode of the conventional system is replaced by a transistor of the usual bipolar type (with collector, base and emitter electrodes) whose emitter is tied to the junction point between the series capacitor and the charging resistance for the shunt capacitor, that resistance being not necessarily a diode. The collector of the transistor is connected to a supply of driving voltage (positive in the case of an NPN transistor) while its base is tied to a tap of a voltage divider inserted between that supply and the common input and output terminal of the circuit. The voltage $V_A$ of the emitter and therefore of the junction point, on a half-cycle (here assumed to be negative) of the input oscillation causing the transistor to conduct, will then differ from the potential of the voltage-divider tap by the base/emitter threshold voltage $V_{be}$ of the transistor. The tap voltage can be so chosen that the extreme value of the emitter voltage $V_A$ equals the reference potential of the common terminal. Alternatively, voltage $V_A$ may be made more positive or negative (with an NPN or a PNP transistor) than that reference potential with the aid of a suitable biasing source inserted between the voltage divider and the common terminal.

BRIEF DESCRIPTION OF THE DRAWING

The above and other features of our invention will now be described in detail with reference to the accompanying drawing in which.

SPECIFIC DESCRIPTION

Figure 1:
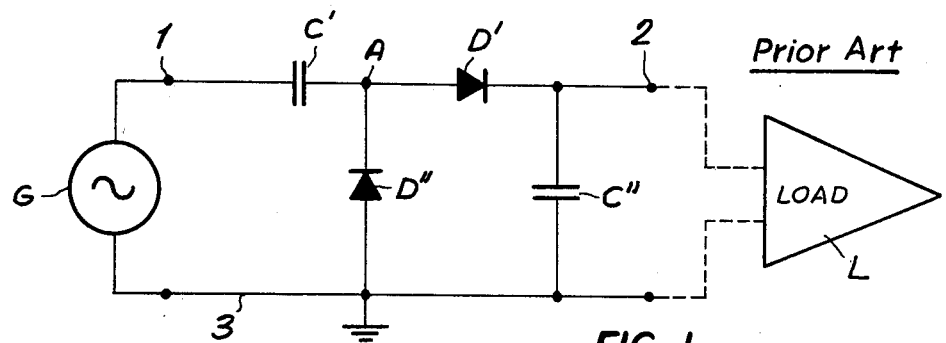
FIG. 1 is a circuit diagram of a conventional voltage-boosting detector.

The conventional detector circuit of FIG. 1 comprises a source of amplitude-modulated carrier oscillations, shown as an alternating-current generator G, connected between an input terminal 1 and a grounded bus bar 3 serving as a common input and output terminal. A load L, which may be an operational amplifier, is connected across bus bar 3 and an output terminal 2.

A series capacitor C' and a series diode D' lie between terminals 1 and 2, forming with each other a junction point A which is returned to ground through a shunt diode D''. When the oscillation of generator G drives the input terminal 1 positive with reference to ground, capacitor C' transmits a positive-going pulse via diode D' to capacitor C'' which therefore acquires a positive charge. On the subsequent negative half-cycle, this charge is trapped by the two cascaded diodes D' and D'', except for a high-resistance leakage path through the load L or some other nonillustrated impedance defining with that capacitor a network of desired time constant. When input terminal 1 goes negative, junction point A can follow that voltage swing until its potential falls below ground potential to a level $-V_D$ determined by the forward drop $V_D$ of diode D''. On the next positive swing, point A starts at this potential $-V_D$ and eventually reaches a peak $V_p + |V_n| - V_D$ where $V_p$ and $V_n$ are the positive and negative amplitude peaks of the input voltage from oscillator G. As the carrier amplitude changes, voltage $V_A$ follows suit with the same difference $V_D$.

Figure 2:
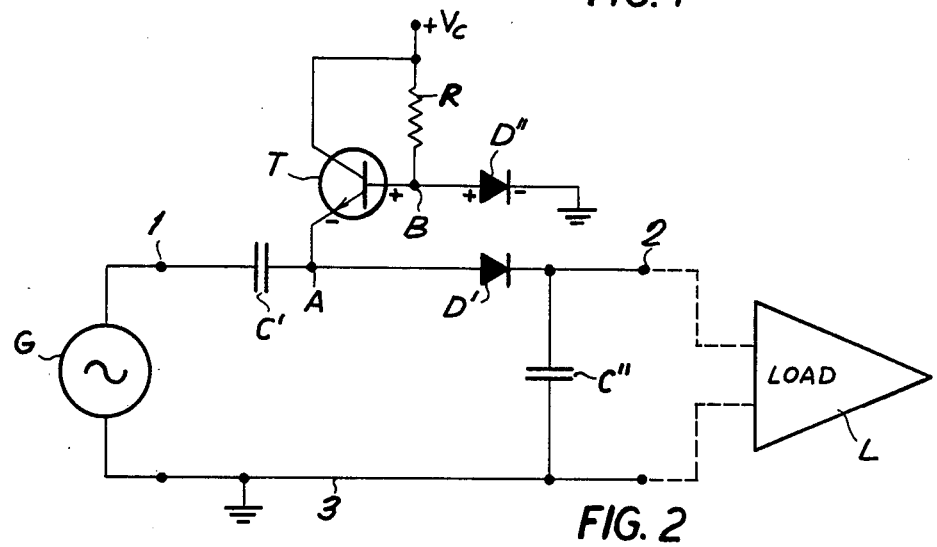
FIG. 2 is a diagram similar to FIG. 1, illustrating our present improvement.

In FIG. 2 we have illustrated our improved detector circuit wherein the junction point A is tied to the emitter of an NPN transistor T whose base is grounded through the shunt diode D''. The collector of transistor T is connected to a supply of positive voltage $+V_c$ and is also returned to the base through a resistor R which forms a voltage divider with diode D''. The potential of a tap B on that divider, to which the transistor base is connected, is a small fraction of the collector voltage $V_c$ inasmuch as the divider section lying between point B and ground is constituted by the forward resistance of diode D''. That forward resistance is substantially equal to the resistance of the base/emitter path of transistor T in its saturated state whereby the voltage drops across that path and across the diode D'' balance each other; the diode and the transistor may be easily so chosen that the thermal coefficients of these two resistances are substantially identical so that the balance is not affected by changes in temperature.

During negative half-cycles of the voltage of generator G, transistor T conducts and maintains the junction point A at a voltage $V_A$ practically equal to ground potential. Thus, the shortfall $V_D$ discussed with reference to FIG. 1 has been eliminated and point A reaches a potential of $V_p+|V_n|$ on the next positive swing.

Figure 3:
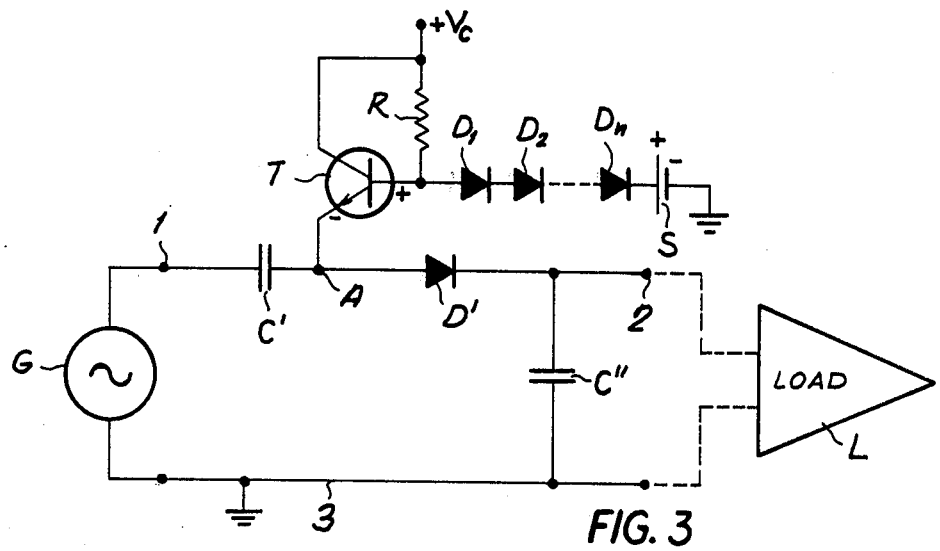
FIG. 3 is another diagram similar to FIG. 1, showing an alternate embodiment of our invention.

As shown in FIG. 3, the single diode D'' of the voltage divider illustrated in FIG. 2 may be replaced by a cascade of such diodes $D_1, D_2 \ldots D_n$ whose combined resistance, of course, exceeds that of the base/emitter path of transistor T though being preferably of the same order of magnitude. This insures that the minimum voltage of junction point A is always positive with reference to ground, e.g. at $+V_D$ whereby the voltage on terminal 2 will range between ground and $V_p+|V_n|$. The same effect can be had by inserting a source S of biasing voltage, here shown as a battery, between the voltage divider and ground with the proper polarity, i.e. with an ungrounded positive terminal in the case of an NPN transistor. While the two features have been shown combined in FIG. 3, it will be apparent that either of them may be employed separately.

Figure 4:
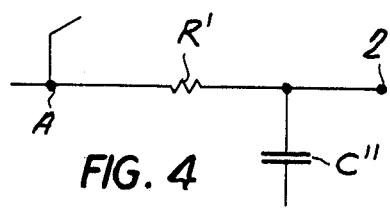
FIG. 4 illustrates a partial modification of the circuits of FIGS. 2 and 3.

In some instances the diode D' of FIG. 2 or 3 could be replaced by a small resistor R' as illustrated in FIG. 4, especially with circuits designed for high carrier frequencies in which the flow of a significant discharge current from output terminal 2 back to junction pont A during alternate half-cycles is nonobjectionable. Such resistors, substantially smaller than resistor R, may also be used in lieu of diodes D'' or $D_1 - D_4$ in FIGS. 2 and 3.

Naturally, all the polarities will have to be reversed if a PNP transistor is used in place of NPN transistor T.

Our improved detector shown in FIGS. 2 and 3 may be realized by integrated circuitry.

We claim:
1. A voltage-boosting detector circuit comprising:
   an input terminal and a common terminal connectable across a source of amplitude-modulated oscillations;
   an output terminal connectable together with said common terminal across a load;
   a series capacitor inserted between said input and output terminals;
   a shunt capacitor inserted between said output and common terminals in cascade with said series capacitor;
   a charging resistance for said shunt capacitor inserted between said series capacitor and said output terminal, said charging resistance and said series capacitor having a common junction point;
   a transistor with a collector, an emitter and a base, said base being tied to said junction point;
   a supply of driving voltage for said transistor connected to said collector; and
   a voltage divider inserted between said supply and said common terminal, said base being connected to a tap on said voltage divider.

2. A detector circuit as defined in claim 1 wherein a section of said voltage divider lying between said tap and said common terminal has a resistance on the order of magnitude of the base/emitter resistance of said transistor.

3. A detector circuit as defined in claim 2 wherein said section includes a generator of biasing voltage with a polarity corresponding to that of said supply.

4. A detector circuit as defined in claim 2 wherein said section comprises a diode conductively inserted between said supply and said common terminal.

5. A detector circuit as defined in claim 4 wherein the forward resistance of said diode and the base/emitter resistance of said transistor have substantially the same magnitude and thermal coefficient of resistance.

6. A detector circuit as defined in claim 2 wherein said section comprises a plurality of cascaded diodes.

7. A detector circuit as defined in claim 1 wherein said voltage divider includes a series of diodes between said tap and said common terminal.

8. A detector circuit as defined in claim 1 wherein said charging resistance comprises the forward resistance of a diode.

* * * * *